United States Statutory Invention Registration [19]

[11] Reg. Number: H526

Miller [43] Published: Sep. 6, 1988

[54] NON-METALLIC CHASSIS STRUCTURE WITH ELECTROMAGNETIC FIELD ATTENUATING CAPABILITY

[75] Inventor: Martin B. Miller, Baltimore, Md.

[73] Assignee: The United States of America as represented by the Secretary of the Air Force, Washington, D.C.

[21] Appl. No.: 112,007

[22] Filed: Oct. 19, 1987

Related U.S. Application Data

[63] Continuation of Ser. No. 705,834, Feb. 26, 1985, abandoned.

[51] Int. Cl.[4] ..... H05K 9/00; B23P 19/04

[52] U.S. Cl. ..... 361/424; 174/35 MS; 29/460

[56] References Cited

U.S. PATENT DOCUMENTS

| | | | |
|---|---|---|---|
| 3,007,160 | 10/1961 | Halpern | 343/18 |
| 3,187,281 | 6/1965 | Weiner et al. | 361/424 |
| 3,230,375 | 1/1966 | Wagoner et al. | 174/35 MS |
| 3,332,860 | 7/1967 | Diebold et al. | 174/35 MS |
| 3,806,928 | 4/1974 | Costanza | 343/18 A |
| 3,816,911 | 6/1974 | Knappenberger | 361/424 |
| 3,938,152 | 2/1976 | Grimes et al. | 343/18 |
| 4,371,742 | 2/1983 | Manly | 174/36 |
| 4,408,255 | 10/1983 | Adkins | 361/382 |
| 4,544,571 | 10/1985 | Miller | 174/35 MS |

FOREIGN PATENT DOCUMENTS

| | | | |
|---|---|---|---|
| 0884659 | 7/1949 | Fed. Rep. of Germany | 174/35 MS |
| 3133441 | 3/1983 | Fed. Rep. of Germany | 174/35 R |
| 0067196 | 5/1980 | Japan | 174/35 MS |
| 0391762 | 11/1973 | U.S.S.R. | 361/424 |

*Primary Examiner*—Stephen C. Buczinski
*Assistant Examiner*—Linda J. Wallace
*Attorney, Agent, or Firm*—Gerald B. Hollins; Thomas L. Kundert; Donald J. Singer

[57] ABSTRACT

An electronic equipment chassis structure using non-metallic plastic material such as epoxy-impregnated fiberglass together with layers of shielding metal film, preferably of copper overlaid by nickel. Desirable radio frequency shielding is achieved in comparison with the metal chassis structures and in the presence of decreased chassis mass, lower fabrication cost and chassis change enabling flexibility. Examples of material characteristics, representative fabrication costs, and attained radio frequency attenuation properties are included.

19 Claims, 7 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

NON-METALLIC CHASSIS STRUCTURE WITH ELECTROMAGNETIC FIELD ATTENUATING CAPABILITY

RIGHTS OF THE GOVERNMENT

The invention described herein may be manufactured and used by or for the Government of the United States for all governmental purposes without the payment of any royalty.

This application is a continuation of application Ser. No. 705,834, filed Feb. 26, 1985, now abandoned.

BACKGROUND OF THE INVENTION

This invention relates to the field of laminate structures and to a class of such structures used for both mechanical support and electromagnetic radiation shielding in electronic apparatus.

Organic material structures are increasingly selected for fabricating the chassis, cabinets, enclosures, racks, cases and bases employed in modern military and commercial electronic equipment. Herein such structures are collectively called chassis or enclosures with the terms chassis and enclosure being used interchangeably. A large incentive in the movement to organic material structures for military electronic equipment stems from the present peacetime environment for military development wherein small production runs and frequent design changes are major development considerations. The absence of standardized shapes and dimensions for the variety of electronic systems purchased by government agencies together with the small number of large quantity production runs available have also contributed to the need for flexible and low-cost structures.

Metallic materials especially aluminum sheet metal, have previously been used in ground-based and airborne electronic equipment structures and doubtless will continue to be favored for many such applications. Aluminum sheet metal in thicknesses of 0.062 inch, 0.092 inch, 0.125 inch, and 0.188 inch are particularly popular in constructing such present-day military electronic equipment. Increasingly, however, the flexibility, weight considerations, and other desirable properties of non-metallic materials such as fiberglass-reinforced with an epoxy impregnant are desirable for electronic systems. With the advent of integrated circuit electronics, for example, the need for the structural strength of metallic enclosures and has decreased while the pressure for small size, conformable physical shape, light weight low cost, and predictable reliability have remained present and increasing in intensity.

In the realm of non ground-based equipment, the electronic systems designed for spacecraft or modern high-performance aircraft are particularly demanding examples of the high quality, performance-driven electronic system having unique enclosure requirements which are often best met by non-metallic or organic materials. Less notable, but nevertheless important examples of a trend away from the automatic use of metallic structural elements in electronic apparatus are to be found in consumer and automotive electronic equipment where present-day practice is to incorporate plastic materials for all but the most severely stressed mechanical components of an electronic chassis. Present-day television receivers, for example, employ cabinets, printed circuit boards, supporting structures, and even carrying handles fabricated from organic plastic materials and rely on metal fittings only in, for example, mounting the cathode ray tube, and in some cases, for a skeleton framework.

Despite the desirability of plastic and organic structures used in these applications, there remains a need for electromagnetic shielding both between portions of a given circuit and for containment or exclusion of electromagnetic fields. Such fields affect the performance of nearby electronic apparatus, cause undesirable exposure of living organisms to electromagnetic radiation, and contribute to the military detectability of an electronic apparatus. The term "interference active" or "active" is used herein to generically describe electronic equipment which may be either sensitive to externally-sourced electromagnetic radiation or act as a source of electromagnetic radiation that is undesirable and in need of confinement—that is to represent both EMI/RFI receivers and transmitters. EMI is, of course, an abbreviation for electromagnetic interference and RFI designates radio frequency interference. In either the electromagnetic radiation receiver or transmitter case, the electromagnetic radiation can be of the electric field (E field) or magnetic field (H field) type, or a combination of E and H fields.

Accompanying the need for electromagnetic shielding, particularly in high-performance and rugged electronic equipment of the type designed for military use, is the need for heat conduction from the electronic components of a system, and heat dissipation to the surrounding environment, together with a need for large and highly electrically conductive ground planes which serve to establish a zero electrical signal reference point in most systems.

An organic layer and metal film layer laminate composition is found desirable for meeting these needs in many electronic systems. In the case of ground-based radar and similar high-frequency electronic equipment, the properties of electrical conductivity and magnetic shielding are found to be particularly determinative of the materials used in such laminate structures.

The patent art includes several examples of laminate structures used in electronic equipment. This art includes the patent of Leonard J Costanza U.S. Pat. No. 3,806,928, which concerns a laminated sandwich joint structure for honeycomb sections subjected to radiation at radar frequencies. The Costanza patent is concerned with maintaining the electrical continuity between large multi-layer sections of objects such as a jet engine air intake diffuser where it is desirable to maintain the electrical properties of the structure without abrupt changes resulting from the presence of physical joints. The structure of the Costanza patent includes epoxy-impregnated fabric layers with some of the fabric material being impregnated by conductive carbon such as acetylene black or furnace black, and with the fabric layers being comprised of woven fiberglass filaments. The goal of the Costanza patent is actually to achieve minimum discontinuities in the electrical properties of the connected honeycomb sections in order that radar reflections from the assembled structure are minimized. Conversely, the Costanza arrangement is also useful in constructing radar-transparent honeycomb structures for use in situations where minimum attenuation of a radar signal is desirable, as in a radome for example.

Another example of laminate materials having useful electromagnetic properties is found in the patent of Dale M. Grimes et al, U.S. Pat. No. 3,938,152, which concerns a multi-layer structure useful in absorbing and minimizing reflections of electromagnetic radiation of preselected radar wavelengths. The Grimes et al patent contemplates the use of a ferrimagnetic film which is composed of nickel oxide, zinc oxide, and ferric oxide, or alternately of mixed crystal ferrites which are compounds of cadmium, iron, and lithium. Alternately, the Grimes patent teaches the use of hexagonal ferrites which include zinc, barium, iron and oxygen. In the Grimes structure these compositions serve as signal attenuators and are applied over a highly-conductive planar backing member.

Another example of a radar signal attenuating laminate structure is found in the patent of Otto Halpern, U.S. Pat. No. 3,007,160, which concerns a laminate film structure wherein electrical resonance is achieved in the outermost film layer. This layer is also made to be electrically lossy and incorporates copper flakes or similar dispersed conductive material. The Halpern structure contemplates the use of an adhesive layer between the resonating—absorbing layer and a metallic reflecting layer.

Yet another multi-layer electromagnetic field attenuating structure is shown in the patent of Harold Adkins, U.S. Pat. No. 4,408,255, which is concerned with an electromagnetic interference (EMI) radiation shield that is useful in such equipment as electronic data processing machines. The Adkins patent considers both the electrical or E field and the magnetic or H field components of radio frequency intereference originating in data processing circuitry. The Adkins patent contemplates the combination of a magnetically permeable material with a sheet of conductive material bonded on one side thereof. The absorptive material in the Adkins shield structure may comprise steel wool, carbon-impregnated rubber, ferrite in a plastic-stranded carrier, or some combination of similar lossy materials; the conductive material layer is comprised of conductor having sheet resistivity preferably in the range of $1.5\times10^{-6}$ to $100\times10^{-6}$ ohm-cm.

Yet another radio frequency shielding arrangement is shown in the patent of William A. Manly, U.S. Pat. No. 4,371,742, which discloses an absorptive shield for transmission lines. The shield of the Manly patent is composed of flexible materials filled with ferromagnetic or ferrimagnetic powders of selected particle size and distribution; the particles used may include varieties of iron, nickel, and cobalt. The absorptive magnetic material of the Manly patent is also shown configured into objects such as an enclosure for electronic equipment.

SUMMARY OF THE INVENTION

An object of the present invention is to provide an electronic chassis structure which is largely non-metallic in composition, Another object of the invention is to provide a structural composition useful in the fabrication of electronic apparatus having need for an alternate to conventional metal fabrication, together with the need for electromagnetic shielding requirements.

Another object of the invention is to provide a desirable combination of metallic films for use in non-metallic electronic structural members.

Another object of the invention is to provide an electronic chassis structure which combines a non-metallic substrate with a multi-layer double surface metal film shielding arrangement.

These and other objects are achieved by providing a chassis for use with radio frequency electromagnetic interference active electronic apparatus that includes an organic material substrate member configured as a closable geometric shape having a plurality of angularly disposed connected-together surface portions and a closure means for closing the substrate member, with the closure means including a closure surface portion. The chassis includes arrangements located on the surface portions for mounting components of the electronic apparatus, plus a multi-layered electromagnetic radiation energy shielding and physical protection coating located on a plurality of the surface portions, the coating further including a first metallic film layer disposed over both faces of the surface portions in intimate physical contact therewith, a second metallic film layer disposed over the first film layer of the surface portions in physical contact with the first film layer and wherein the first and second metallic films are composed of different metals at least one of which is a good electrical conductor.

DETAILED DESCRIPTION

Figure 1:
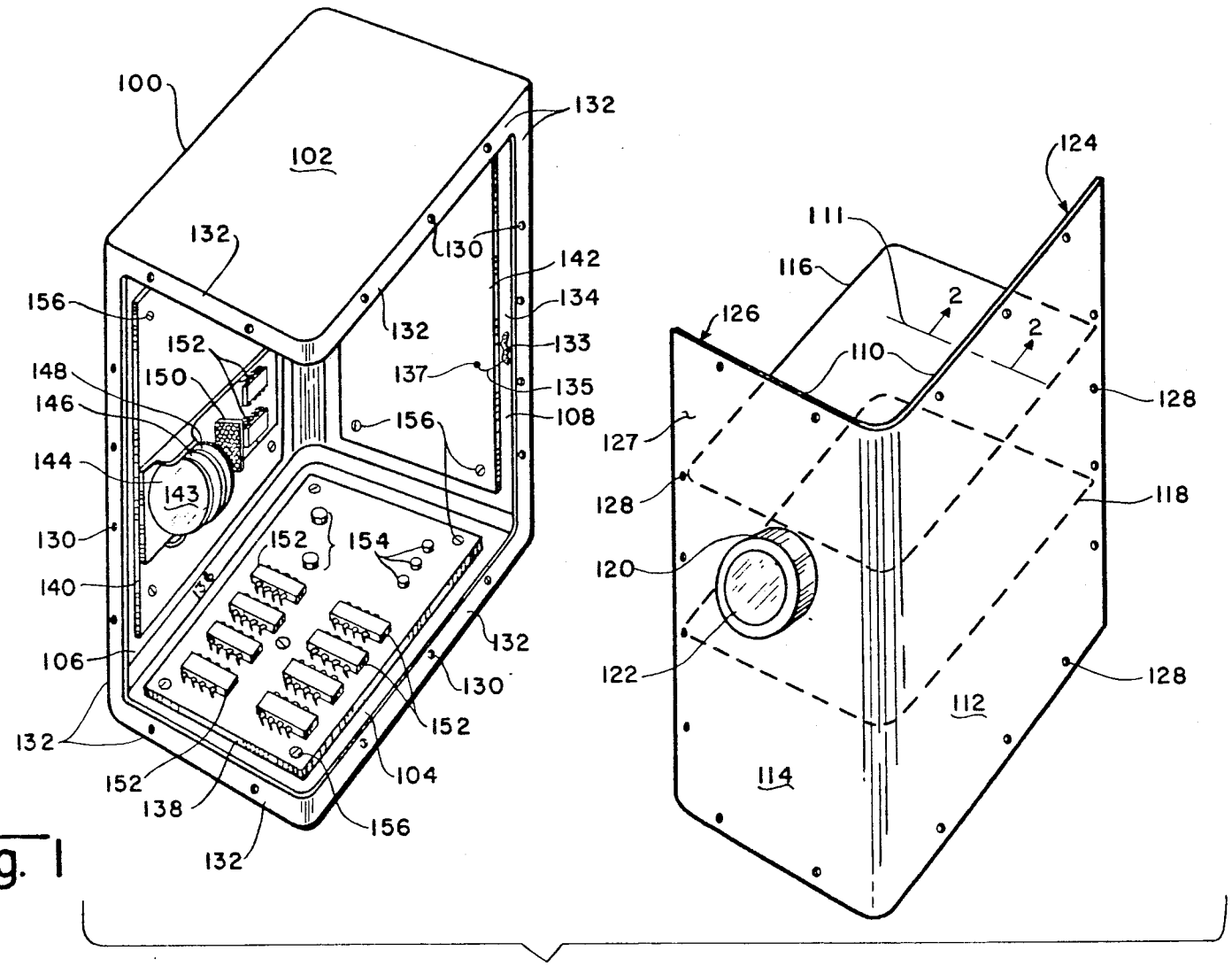
FIG. 1 is an electronic chassis or enclosure in accordance with the present invention together with a representative electronic hardware system.

In FIG. 1 of the drawings there is shown an exploded view of a typical electronic chassis or enclosure which may be fabricated according to the present invention. The FIG. 1 chassis includes a closable or main portion 100 having top and bottom ends 102 and 104 and fixed sides 106 and 108 which meet the ends 102 and 104 in substantially right angles. The FIG. 1 chassis also includes a cover or closure member 110 which is also formed in the shape of a right angle and is arranged to mate with the open sides of the main portion 100. The cover or closure member 110 includes a pair of sides 112 and 114 and also includes a pair of integrally connected internal shield members 116 and 118 which surround a portion of the enclosed electronic apparatus when the cover 110 is fixed in place on the chassis main portion 100.

The cover 110 in FIG. 1 further includes a window member 122 and window housing 120, which serve to admit light from an examined scene to the electro-optical apparatus enclosed by the FIG. 1 chassis. The cover 110 is arranged to accommodate a plurality of fastening members 128 which may be in the form of machine screws or spring engaging fasteners of the type known in the fastening art. The fastening members 128 cooperate with mating portions 130 located in an orthogonal lip 132 surrounding the opening of the chassis closable main portion 100 in FIG. 1.

A plurality of printed circuit boards indicated generally at 138, 140, and 142 are shown mounted in the closable portion of the FIG. 1 chassis by way of machine screws or the like 156 which may engage the respective side and end portions of the FIG. 1 chassis by way of holes, standoff supports and nuts, or alternately and preferably, by way of attached bosses integral with and extended inward from the inner surface of the fixed sides and bottom of the FIG. 1 chassis.

Mounted on the printed circuit board 140 is a representation of an electro-optic scanner 143, an apparatus typical of the small signal, electromagnetic radiation sensitive equipment which might be mounted in a FIG. 1 type chassis. Other such radiation sensitive equipment might include radio frequency receivers, ionized particle detectors and the sense amplifiers used in EDP systems. Alternately, a chassis of the FIG. 1 type might also be useful for enclosing an apparatus such as an oscillator which tends to generate strong electromagnetic fields capable of disrupting adjacent electronic circuits or providing undesirable detectability if allowed to escape from the chassis.

The electro-optic scanner apparatus 143 generally includes lenses 144, 146 and 148, an optical signal to electrical signal transducing retina 150, a plurality of integrated circuit packages 152 which may comprise, for example, a RAM memory and a plurality of discrete transistors 154.

As indicated above, the internal shield members 116 and 118 surround the electro-optic scanner apparatus 143 when the cover 110 is placed in mating position with the closable portion of the FIG. 1 chassis, such shielding preventing the coupling of strong signals from the integrated circuits 152 and the transistors 154, for example, into the low-level circuitry of the retina 150 and the preamplifiers associated therewith. The construction of the bottom and side members 104, 106, 108, 112, and 114 is also arranged to minimize the coupling of externally-sourced electromagnetic radiation to the low-level circuitry of the scanner 143.

The scanner and electronic circuitry shown in FIG. 1 may, for example, be a part of an electronic imaging apparatus intended for mounting in an aircraft or spacecraft for the purpose of transmitting signals representing viewed images to a remote location; the scanner 143 therefore could comprise a portion of an overall system and could be the computer-controlled generator of modulating signals for a radio frequency transmitter which is not shown. The radio frequency electric and magnetic fields from such as transmitter would, however, require exclusion from the low-level circuitry of the retina 150 thereby necessitating use of shielding construction in the FIG. 1 apparatus and in the radio frequency circuitry housing.

In the present peacetime military environment an electronic subsystem such as shown in FIG. 1 would probably be fabricated on a small quantity basis for test, evaluation, and design evolution with quantities between 1 and 40 units being commonly produced. In addition to this relatively low production quantity, evolutionary changes such as, for example, changing of lens sizes or providing additional openings in the FIG. 1 chassis for new system integration connections are to be expected during the evolution. In view of this environment, a flexible chassis fabrication arrangement adaptable to, for example, an average 12-unit production quantity is desirable.

Figure 2:
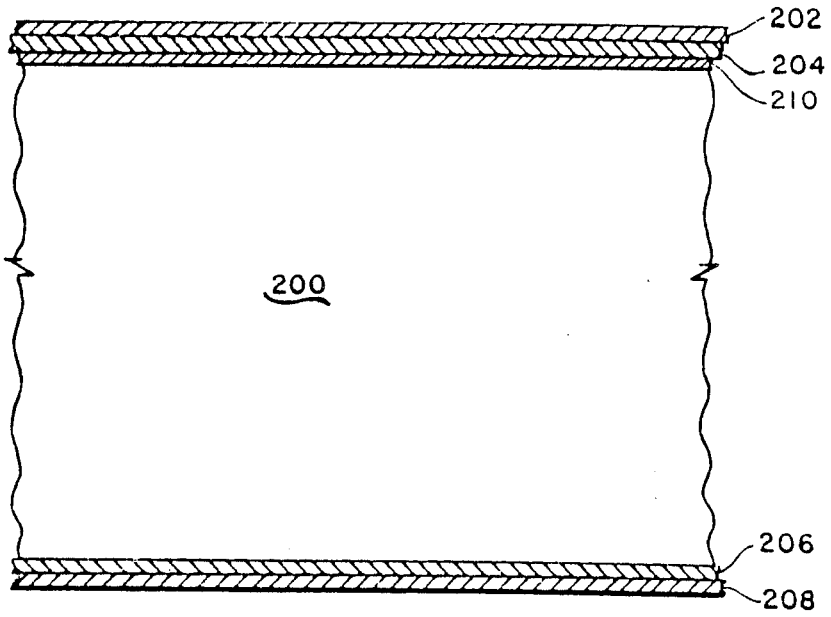
FIG. 2 is an enlarged cross-sectional view of the FIG. 1 chassis taken along the cutting line 2—2 in FIG. 1.

A cross-section view of a non-metallic structural material that is conveniently usable in such a low quantity and low noise environment for the FIG. 1 chassis is shown in FIG. 2 of the drawings. The FIG. 2 cross-sectional view is taken along the cutting line 2—2 shown at 111 in FIG. 1. The closable portion 100 of the FIG. 1 chassis is also presumed fabricated from the type of material indicated in FIG. 2 of the drawings.

In FIG. 2, a non-metallic or organic substrate is indicated at 200, this substrate is, for example, of sixty-thousandths (0.060) inch thickness and is covered on each side by a pair of metallic film layers 202, 204 and 206, 208. The considerations for selecting materials for these film layers are described in some detail below.

With respect to the substrate member 200 in FIG. 2, four of the considerations in selecting among several candidate constructions for such members are described in the data of Table 1–Table 4 below; aluminum is shown as a reference in these tables.

TABLE 1

| MATERIAL | TENSILE STRENGTH (PSI) Longitudinal | Transverse |
|---|---|---|
| Aluminum QQ-A-250/8 | 31,000–38,000 | |
| Fiber Glass Reinforced Epoxy G-10, G-11, FR4 (ASTM-229) | 40,000 | 35,000 |
| Kevlar ® Reinforced Epoxy | 72,000 | |
| Graphite Composite | 81,000 | 84,000 |
| Polyglass (TM) Pultruded | 30,000 | 15,000 |

TABLE 2

| MATERIAL | DENSITY grams/cm3 | pounds/m3 |
|---|---|---|
| Aluminum Alloys | 2.768 | 0.1 |
| Epoxy/Fiber Glass | 1.799 | 0.065 |
| Epoxy/Fiber Glass (Pultruded) | 1.716 | 0.062 |
| Kevlar ® Composite | 1.245 | 0.045 |
| Graphite Composite | 1.605 | 0.058 |

TABLE 3

| MATERIAL | COST PER POUND, $ |
|---|---|
| Fiber Glass Reinforced Epoxy Composite 7781 Glass Cloth, Mil-R-300, Ty I, Resin | 8.30 |
| Kevlar ®-Epoxy Composite 281 Style Kevlar ® 49 | 42.00 |
| Graphite-Epoxy Composite HM Woven Graphite | 100.00 |
| Aluminum Alloy, 6061-T6 | 2.00 |

TABLE 4

| FABRICATION PROCESS | TOOLING COST, $ |
|---|---|
| Injection Molding (Structural Foam) | 131,500 |
| Injection Molding (BMC) | 32,899 |
| Compression Molding (SMC) | 17,000 |
| Pultrusion | 13,000 |
| Hand Layup | 12,000 |
| Metal (Aluminum) Construction | 5,200 |

As illustrated by Table 1 above, the weight saving realized by substituting a non-metallic material for aluminum alloys can vary, depending upon the design requirements for the chassis under consideration. Advanced composite materials such as Kevlar® and graphite-reinforced composites offer greater weight savings than fiberglass reinforced epoxy (e.g., fiberglass cloth impregnated with epoxy resin), but at an increased cost, as shown in Table 3 and Table 4. The composite materials offer better mechanical properties and substantial weight savings in comparison with metal, but are preferably used only in applications where increased performance is required and the increased cost can be justified. The material Kevlar® in these tables is produced by E. I. duPont De Nemours Corporation (duPont) of Wilmington, Del., the name Kevlar® is a registered trademark of duPont.

The tooling cost illustrated in Table 4 is based on a typical moderate sized chassis for a ground-based radar subsystem. As is apparent from these costs, the injection molding and compression molding techniques are principally applicable to large volume production where the high cost of tooling can be amortized over large quantities such as 5,000 parts or more. In the usual military equipment development scenario, this quantity is not available and a small average lot size is common.

The pultrusion process referred to in Table 4 typically involves fabrication of structural members such as channels and angles from fiberglass mat and fiberglass roving using forming dies and a mandrel and employing a curing heat sequence wherein a continuous length of structural shape is formed. The pultrusion process, although attractive for electronic chassis parts construction, is generally found to involve loss of some physical dimensions; the angle of the orthogonal lip 132 in FIG. 1 is, for example, found difficult to control with the accuracy desired for achieving a good EMI/RFI seal with a mating part such as the cover 110 in the FIG. 1 structure.

The tooling costs to mold the typical chassis of Table 4 above by the hand layup method are shown to be lower than any of the other types of molding considered. In addition to a molding tool, only simple tools such as a drill and trim cutter are necessary, and the method is applicable to small quantities of parts. This method is therefore applicable to a variety of requirements and needs only soft tooling instead of expensive hard tooling.

The cost to manufacture several different quantities of the typical chassis referred to in Table 4 by the several indicated methods and excluding a cover of the type 110 in FIG. 1 are shown in Table 5 below.

TABLE 5

| Units Mfd. | Sheet Metal Fab Aluminum | Injection (BMC) | Compression | Hand Layup | Injection (Struct Foam) | Pultrusion from Channels & Angles |
|---|---|---|---|---|---|---|
| 1 | $6,236 | $33,255 | $22,940 | $12,551 | $135,913 | $14,495 |
| 10 | 1,107 | 3,696 | 2,806 | 1,751 | 13,770 | 1,882 |
| 12 | 920 | 3,098 | 2,434 | 1,551 | 11,508 | 1,649 |
| 25 | 669 | 1,673 | 1,464 | 1,031 | 5,627 | 1,042 |
| 50 | 553 | 1,015 | 1,017 | 791 | 2,912 | 7,610 |
| 100 | 495 | 686 | 793 | 617 | 1,555 | 621 |

Cover and metallization costs are not included.

For the small quantity, lightweight configuration chassis, the choice of an epoxy-impregnated fiberglass construction is reasonable. Such a structure is therefore the preferred embodiment for the substrate 200 in FIG. 2. Since a material of this type inherently lacks EMI/RFI shielding capability and the amount of shielding required in an electronic chassis can range from a shielding effectiveness of 30 dB up to 80 dB and beyond, consideration of suitable shielding arrangements in combination with the substrate material is warranted.

Non-metallic structure EMI/RFI shielding can be categorized into three classes:

1. Intrinsically Conductive Copolymers.

This is an emerging class of materials involving the doping of a plastic raw material with a doping gas in order to achieve a surface resistivity on the order of 10 ohms per square. Chemical stability of the doped plastic material is a subject of continuing state of the art development.

2. Molded Plastics Containing Metal Fillers.

Variously sized aluminum flakes, copper powder, stainless steel wire, and conductive carbon provide shielding in such arrangements—along with the sacrifice of mechanical properties such as impact strength. Expensive tooling is generally required for such structures in order that uniform distribution of the conductive additives be achieved. Both metal fillers and metallized fabrics make the establishment of a low resistance electrical chassis ground somewhat difficult.

3. Surface Metallized Molded Plastic Parts Including Metallization By:

Arc or flame metal spray of metals such as zinc, aluminum and nickel.

Foil or film aluminum adhesively bonded to a plastic substrate.

Conductive organic coating such as paint with silver or nickel particles.

Ion plating of metals such as aluminum, copper and nickel.

Vacuum metallization of aluminum, copper or nickel.

Electro-deposition of copper or nickel or similar materials.

Electroplating of copper, nickel, tin.

An arc or flame spray process requires detailed surface preparation, for good adhesion—by use of grit blast, plasma or chemical etch, or the use of base coat primer. This process often encounters problems of non-uniform thickness flaking, blistering, and warping of the plastic during the spraying or preparing processes. EMI/RFI shielding in the range of 60 to 90 dB is, however, achievable with the arc or flame spray process coatings.

The complex shape of many electronic chassis severely limits the use of film and foil metallizations. Such shielding arrangements also necessitate the use of a conductive adhesive or sealer at the seams of the shielding material.

Non-uniformity in thickness and difficulty in establishing good electrical grounding are problems attending the application of organic conductive coatings such as paint filled with graphite, silver, copper or nickel.

Both ion plating and vacuum metallization techniques involve processing in a vacuum chamber with ion plating resulting in particle fusion to the plastic surface with greater adhesion than occurs in vacuum metallization. Both methods, however, produce only thin coatings having low shielding effectiveness and high susceptibility to mechanical abuse.

Electroless deposition for the nickel film and electroplating (electrolytic deposition) for the copper film when used in the company of a conditioned or etched plastic surface is found to be the most satisfactory of the possible laminate alternatives. The preferred non-electrical deposition process for the present invention is proprietary to the Shipley company of 2300 Washington Street, Newton Mass. A 02162 and is identified as the Niposit® NL63 process. The name Niposit® is a registered trademark of the Shipley company.

Several methods for conditioning the surface of a fiberglass epoxy structure to achieve optimum metal laminate adhesion during temperature cycling between −54° C. and +68° C. are shown in Table 6. Table 6 is based on one inch wide by four inch long samples.

TABLE 6

| Sample No. | Surface Preparation | Peel Strength, psi |
|---|---|---|
| 1 | Not Treated | 8.75–9.0 |
| 2 | Vapor Degreased with Chlorothane Vapor | 7.0–8.2 |
| 3 | Abraded With Scotch Brite Pad & Vapor Degreased | Plating not Peelable (Brittle) |
| 4 | Vapor Honed & Vapor Degreased | Plating not Peelable (Brittle) |
| 5 | Plasma Cleaned | 0.25–1.0 |
| 6 | Chromic/Sulfuric Acid Etched at 160° F. for 5 Minutes | 8.5–9.0 |

Peel strength is measured after thermal cycling.

The table 6 samples are also found to be capable of enduring temperature cycling without damage to the attachment of the electroplated finish. Specifically, blisters and separations between an electroplated finish and the epoxy fiber glass surface of the table 6 samples are absent after ten cycles of exposure to −55° C. for ten minutes, room temperature for five minutes, and 125° C. for fifteen minutes. Even better adhesion between an epoxy impregnated fiberglass substrate and electroplated copper and nickel films can be obtained through improved plating processes, as are known in the art.

Table 7, shown at the end of this specification, provides a comparison of the considered metallization processes for the present electronic chassis construction.

Figure 5:
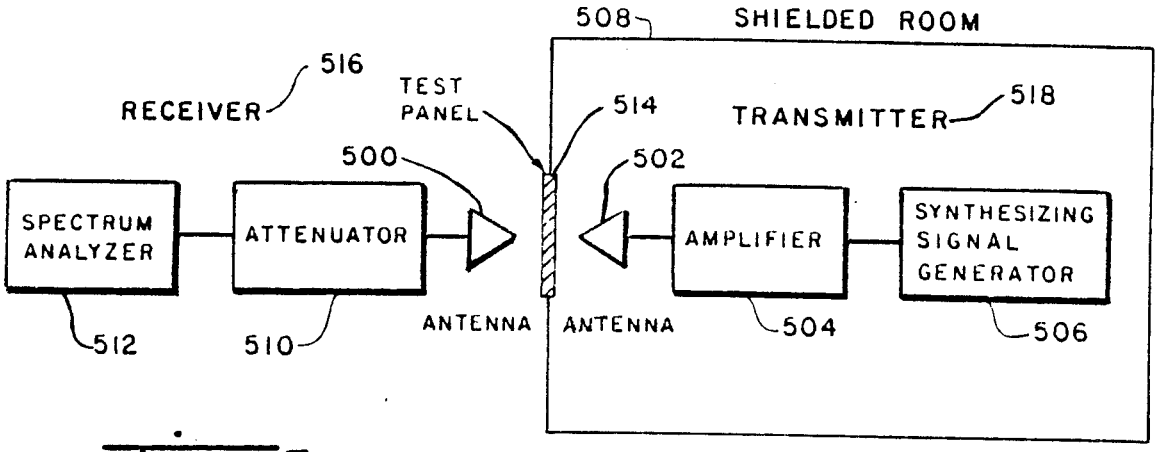
FIG. 5 shows the test arrangement for measuring shielding effectiveness.

An apparatus for measuring the shielding effectiveness of several different coatings for the substrate material 200 in FIG. 2 is shown in FIG. 5 of the drawings. The FIG. 5 measuring apparatus includes a radio frequency receiver 516 coupled to a radio frequency transmitter 518 through a sample 514 of the FIG. 2 material which may be square in shape and have, for example, dimensions of 60 cm on each side of the square. The sample 514 is located in an aperture of a shielded room enclosure 508 which houses the source of test radio frequency energy. The radio frequency energy is provided by a signal synthesizing generator 506 and an amplifier 504 which are coupled to a transmitting antenna 502. In a similar fashion the receiver 516 may comprise a spectrum analyzer 512 which is coupled through an attenuator 510 to a receiving antenna 500. The antennas 500 and 502 in FIG. 5 may be varied according to the frequency and the type of radiation being considered, that is, a loop antenna is preferred for magnetic radiation and for electric field radiation at lower radio frequencies, while a dipole antenna or a dipole with companion elements is preferred at higher frequencies. Generally, suitable antennas are known in the radio frequency transmitting and receiving art.

The configuration of four test panels used as samples at 514 in FIG. 5 are shown in Table 8 below.

TABLE 8

Panel #1 - Aluminum QQ-A-250/8 H32 0.16-cm (0.062-inch) thick.

TABLE 8-continued

Panel #2 - G-10 epoxy fiber glass laminate 0.16-cm (0.062-inch) thick with 0.003-cm (0.001-inch) of electroplated copper plus 0.003-cm (0.001-inch) of nickel on both sides.

Panel #3 - G-10 epoxy fiber glass laminate 0.16-cm (0.062-inch) thick laminate with no metallization.

Panel #4 - G-10 epoxy fiber glass laminate 0.16-cm (0.062-inch) thick with CHO-SHIELD 4914, a nickel filled paint, 0.009-cm (0.0035-inch) thick on one side.

Electric and magnetic field strength measurements for the four different test panels are shown in Tables 9 and 10 herein, and normalizations of the results from these tables are shown in Tables 11 and 12.

TABLE 9

| Freq kHZ | Transmitter & Receiver Dist. in Inches | Panel Number and db Attenuation | | | | |
|---|---|---|---|---|---|---|
| | | Open | #1 | #2 | #3 | #4 |
| 10 | 6 | −69.9 | −110.4 | −112.2 | −77.5 | −94.0 |
| 50 | 6 | −38.5 | −121.8 | −123.3 | −41.1 | −95.6 |
| 100 | 6 | −26.4 | −121.3 | −123.0 | −29.1 | −98.2 |
| 500 | 17 | −0.70 | −118.0 | −109.9 | −3.6 | −68.0 |
| 1000 | 17 | −25.8 | −125.0 | −115.7 | −29.0 | −80.9 |

NOTE: Measurements were made using a 41-inch rod antenna and a +23 dB CW signal generator.

TABLE 10

| Freq kHZ | CW Signal Generator Level, dB | Panel Number and Attenuation in db | | | | |
|---|---|---|---|---|---|---|
| | | Open | #1 | #2 | #3 | #4 |
| 10 | −30 | −81.6 | −109.8 | −101.7 | −85.7 | −85.5 |
| 50 | −30 | −86.1 | −119.5 | −116.2 | −89.5 | −89.8 |
| 100 | −20 | −81.4 | −117.9 | −116.6 | −85.0 | −85.1 |
| 500 | +10 | −65.4 | −113.0 | −112.2 | −68.8 | −69.3 |
| 1000 | +15 | −66.8 | −117.1 | −117.5 | −70.0 | −71.7 |

NOTE: Measurements were made using transmitter and receiver distances of one inch and a model ALP-10 loop antenna which is available from Fairchild Electrometrics Inc. of 100 Church Street, Amsterdam NY.

TABLE 11

| Freq kHZ | Transmitter & Receiver Dist Inches | Panel Number and Attenuation in db | | | | |
|---|---|---|---|---|---|---|
| | | Open | #1 | #2 | #3 | #4 |
| 10 | 6 | — | 40.5 | 42.3 | 7.6 | 24.1 |
| 50 | 6 | — | 83.3 | 84.8 | 2.6 | 57.1 |
| 100 | 6 | — | 94.9 | 96.6 | 2.7 | 71.8 |
| 500 | 17 | — | 117.3 | 109.2 | 2.9 | 67.3 |
| 1000 | 17 | — | 99.2 | 89.9 | 3.2 | 55.1 |

NOTE: Measurements here include a 41-inch rod antenna and a +23 dB CW signal generator.

TABLE 12

| Freq kHZ | CW Signal Generator Level, dB | Panel Number and Attenuation in db | | | | |
|---|---|---|---|---|---|---|
| | | Open | #1 | #2 | #3 | #4 |
| 10 | −30 | — | 28.2 | 20.1 | 4.1 | 3.9 |
| 50 | −30 | — | 33.4 | 30.1 | 3.4 | 3.7 |
| 100 | −20 | — | 36.5 | 35.2 | 3.6 | 3.7 |
| 500 | +10 | — | 47.6 | 46.8 | 3.4 | 3.9 |
| 1000 | +15 | — | 50.3 | 50.7 | 3.2 | 4.9 |

NOTE: Measurements were made using transmitter and receiver distances of one inch and a Fairchild ALP-10 loop antenna.

Figure 3:
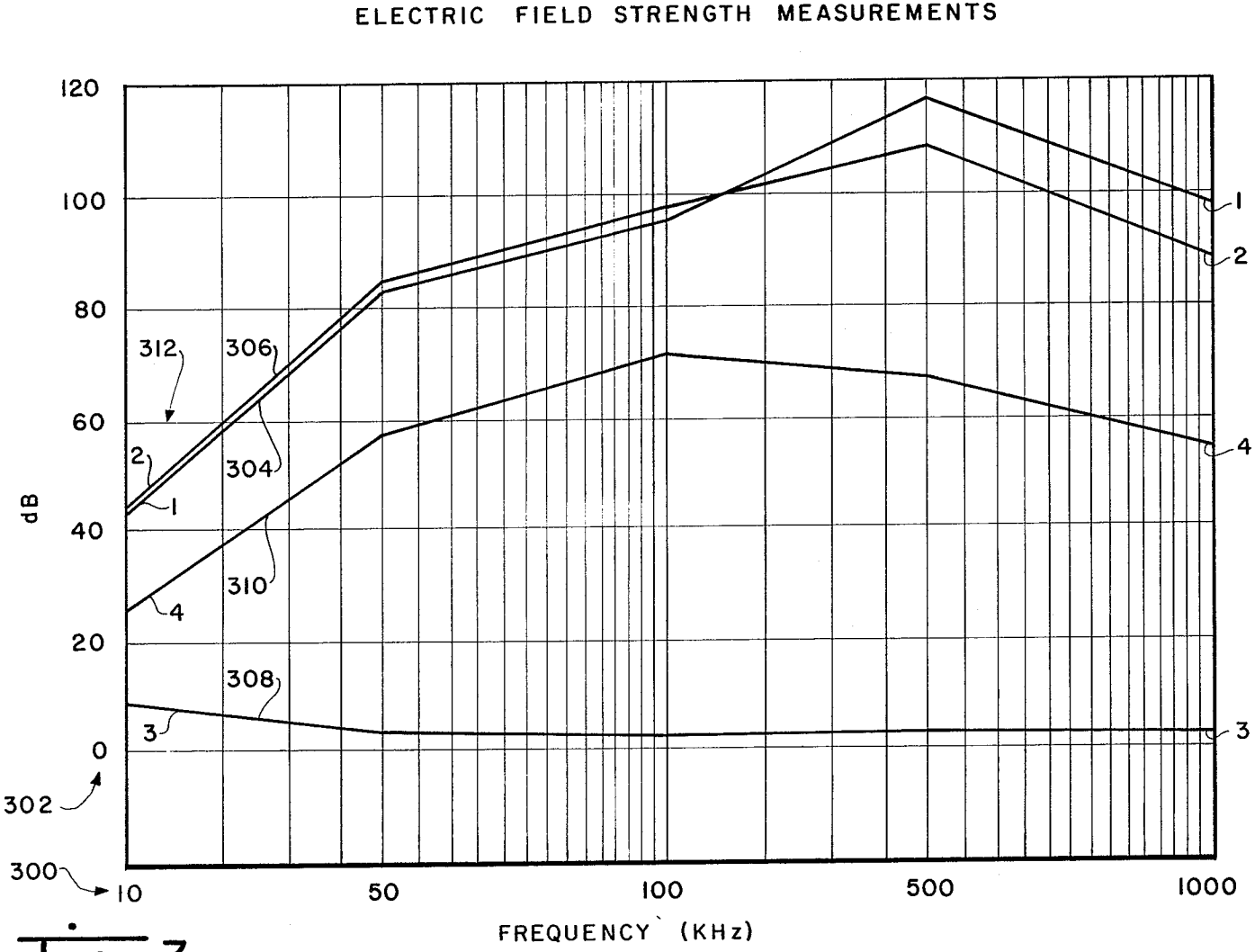
FIG. 3 shows the relationship between shielding effectiveness and frequency for the material used in the FIG. 1 and FIG. 2 structure when subjected to electric fields of varying frequency.
Figure 4:
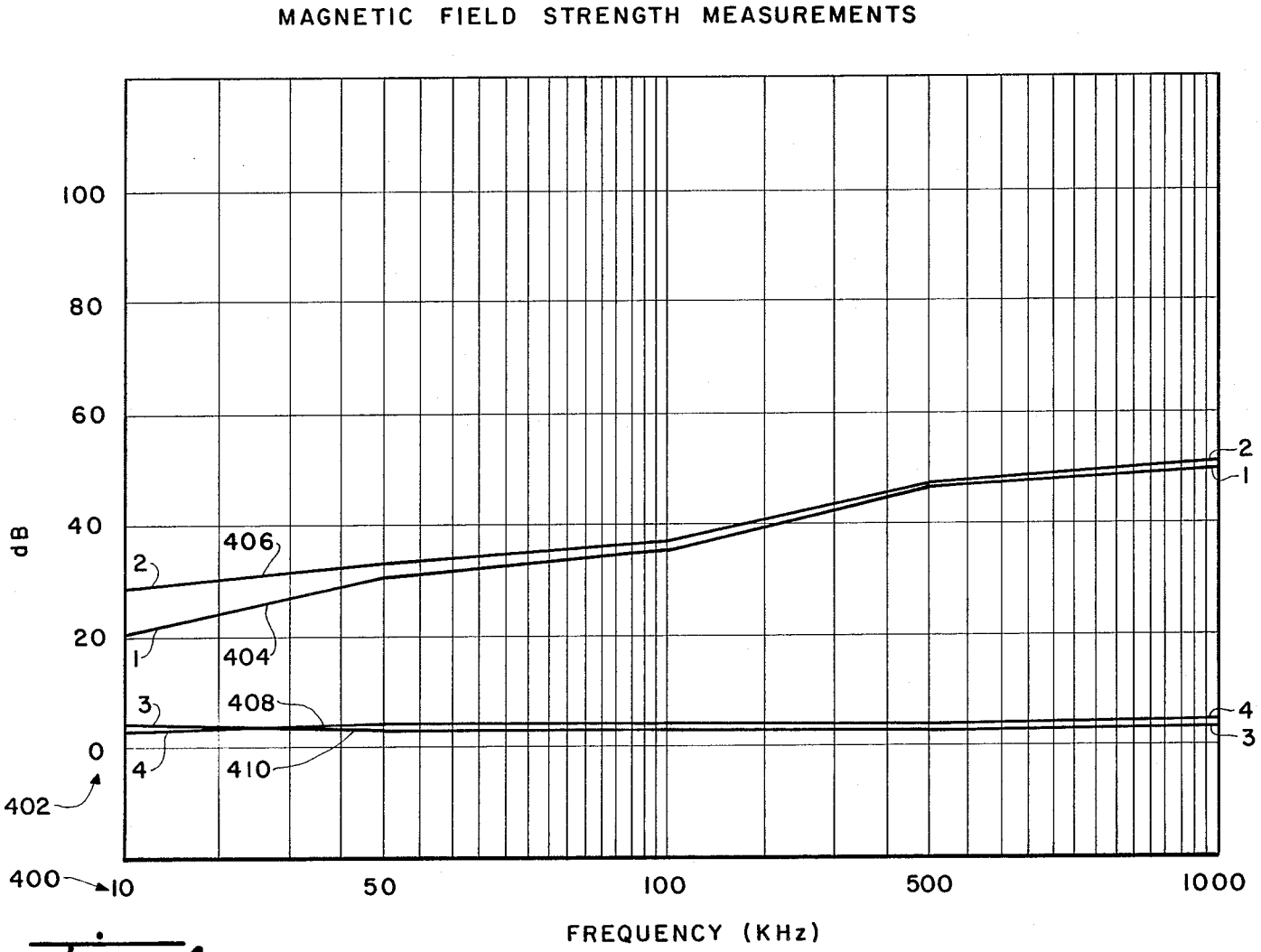
FIG. 4 shows the relationship between shielding effectiveness and frequency for the material used in the FIG. 1 and FIG. 2 structure when subjected to magnetic fields of varying frequency.
Figure 6:
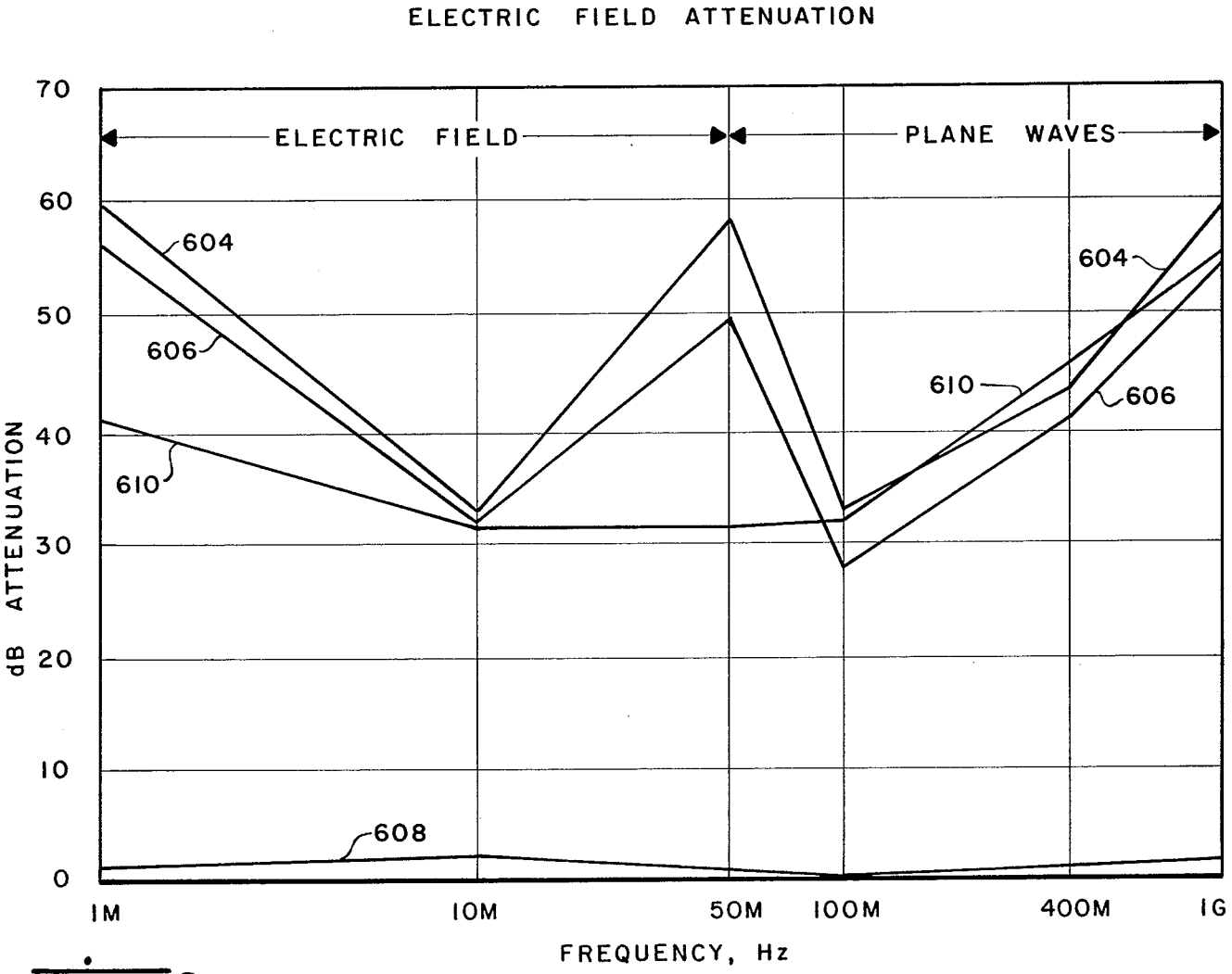
FIG. 6 shows the relationship between electric field shielding effectiveness and frequency using a different frequency scale and different test panel size.
Figure 7:
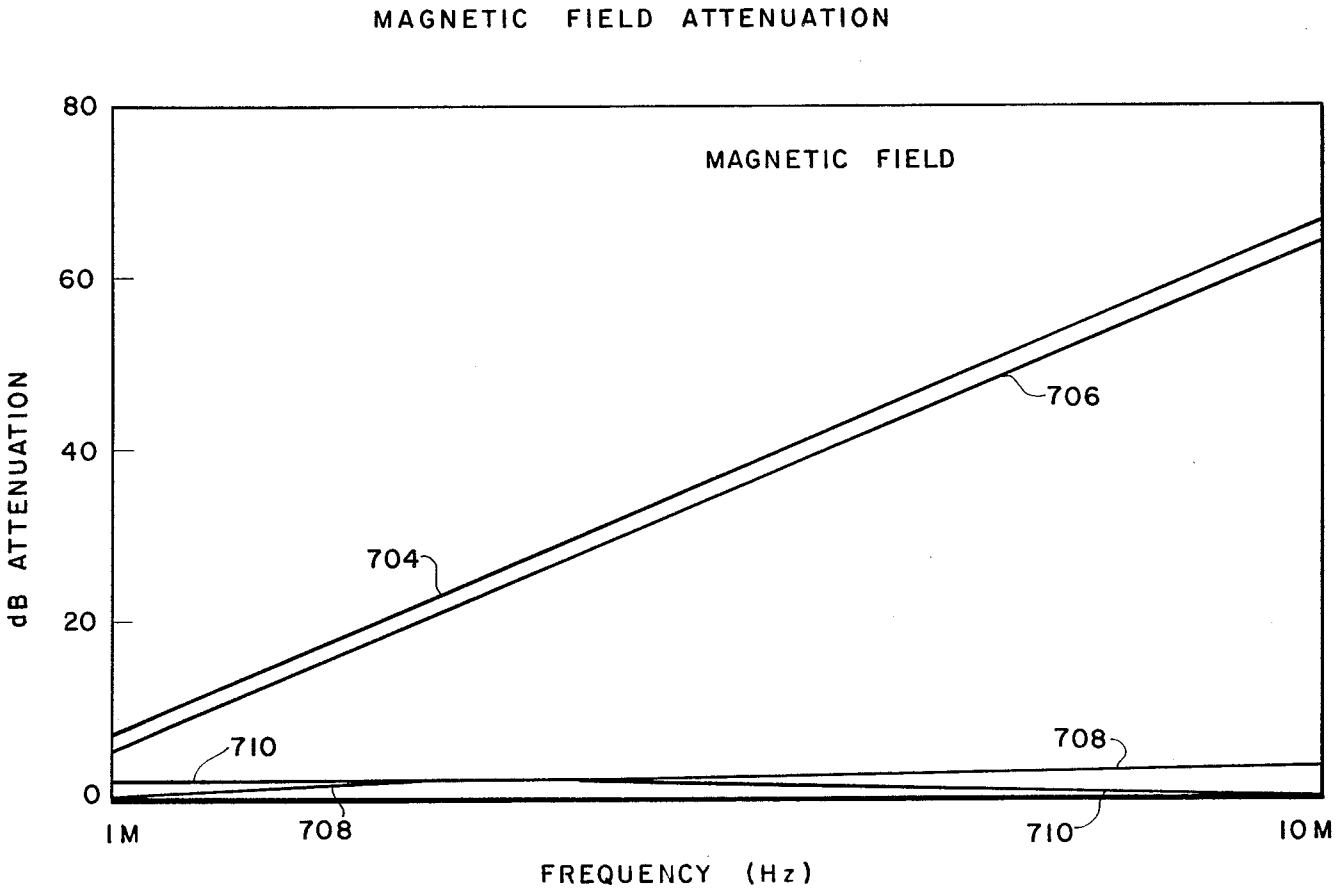
FIG. 7 shows the relationship between magnetic field shielding effectiveness and frequency using a different frequency scale and different test panel size.

The results of Tables 11 and 12 are shown graphically in FIGS. 3 and 4 of the drawings. The family of curves shown in FIG. 3 is plotted on a logarithmic scale of frequencies 300 falling between 10 kHZ and 1000 kHZ or 1 megacycle, the curves represent electric field strength attenuation across the aforementioned square sample of chassis material. The attenuation measurements are plotted along a linear scale of logarithmic values 302. The identifying numbers 312 in FIG. 3 relate the individual curves to the above-identified sample numbers; curve number 1 representing the aluminum sample, curve 2 the epoxy-fiberglass laminate with two layers of metallic film on each side, curve number 3 represents the epoxy-fiberglass laminate with no metallization, and curve number 4 represents the epoxy-fiberglass laminate with a CO-SHIELD 4914 nickel-filled paint, which is manufactured by Chomerics Inc. of 77 Dragon Court, Woburn Mass. 01888. The curves of FIG. 4 show magnetic field attenuation versus frequency for the four identified test panels with the numbers 400, 402, 404, 406, 408 and 410 corresponding to the similar numbers in the 300 series in FIG. 3. One of the main points to be observed in the FIG. 3 and FIG. 4 curves is the similar attenuation characteristics of fiberglass with double metal foil coatings on each surface to the characteristics of a solid aluminum test panel, that is, the curves 304 and 306 and 404 and 406 in FIGS. 3 and 4. The similarity of these curves also extends into the higher frequency range than is represented by the FIGS. 6 and 7 of the drawings. In FIGS. 6 and 7, the attenuation characteristics of smaller-sized test panels measuring 6×6 inches is shown. The sample identities in FIGS. 6 and 7 correspond to those in FIGS. 3 and 4, with the 600 and 700 series numbers being used in lieu of the 300 and 400 series numbers in FIGS. 3 and 4. The amount of energy which can be transmitted through a given hole size in the shielded room 508 accounts for the differences between data in FIG. 3 and FIG. 6 and FIG. 4 and FIG. 7, the smaller hole size permits less radio frequency energy to penetrate, however, the comparison of materials is yet valid.

These Table 11 and 12 and FIGS. 3 and 4 results indicate the favorable capability of coatings of copper and nickel for use respectively at 204, 202 and 206, 208 in FIG. 2. Each side of the substrate 200 is therefore preferably coated with a film of copper which is in turn coated by a film of nickel. In FIG. 2, the film layers 204 and 202 may be regarded as the copper and nickel film layers for the exterior surface of the FIG. 1 closure member 110, and the film layers 206 and 208 as the copper and nickel film layers for the interior surfacer 124 of the closure member 110. Preferably these films are deposited by the electroless process for the copper film and an electrolytic or electroplating deposition for the nickel film.

It is also found that a thin coating of electroless nickel applied to the substrate 200 prior to deposition of the copper layers 204 and 206 improves the adhesion of the copper film layers. Such a coating is represented by the layer 210 in FIG. 2; this adhesion promoting layer 210 is shown to be of lesser thickness than are the previously described or primary film layers 202, 204, 206 and 208 in FIG. 2 in keeping with its thin coating nature.

In the preferred film arrangement, the outer, thicker, film of nickel serves as a hard abrasive resistant external surface to protect the soft copper film beneath it. Metal film layer coatings over one surface of a chassis structure is a viable shielding arrangement; however coating both the inside and outside surfaces of a chassis (e.g., surfaces 126 and 127 in FIG. 1) with such metal films, in addition to providing desirable double shielding, also eliminates the costly process of masking the completed chassis for areas not to be coated. Double coatings also afford double protection against damage to one surface which could result in intense local EMI/RFI leakage in the absence of a second or backup coating. The interior surfaces 124, 126, 134 and 136 of the closable chassis portion 100 and the cover portion 110 in FIG. 1 are therefore preferably coated with the film of copper overlaid by a film of nickel as described in FIG. 2. In a similar fashion, the exterior surfaces of the top, bottom and side members 102, 104 106, 108, 112 and 114 in FIG. 1 are also preferably coated with the copper and nickel films.

Although not shown in the FIG. 1 drawing, a molded-in-place EMI/RFI gasket can be used as an effective seal between the portions 100 and 110 of the FIG. 1 chassis. Other types of seals such as wire mesh gaskets, metal filled elastomers, carbon-filled materials, and honeycomb-core materials enabling ventilatlon also provide adequate seals for the chassis in FIG. 1.

Figure 8:
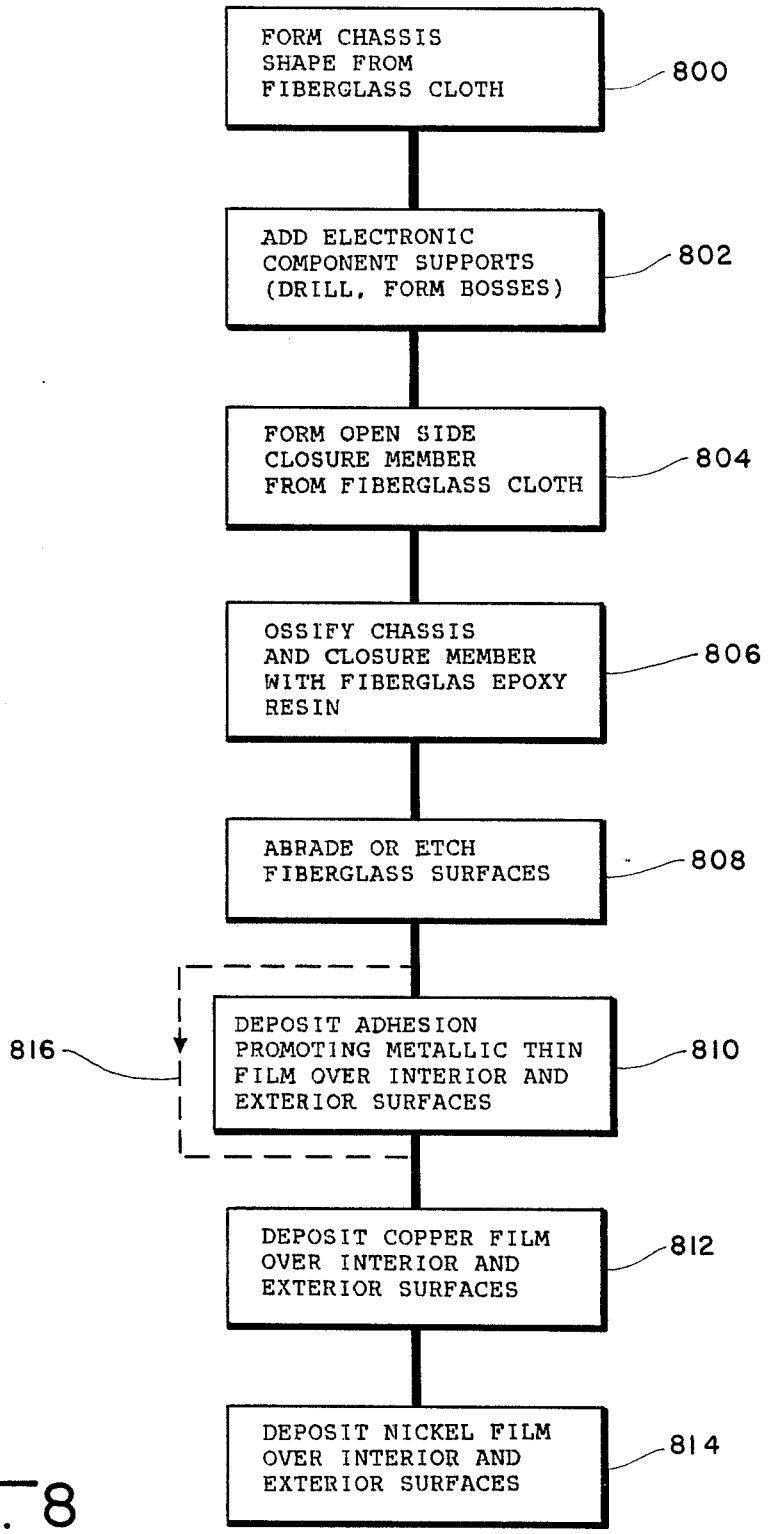
FIG. 8 is a flow diagram for fabricating a chassis of the present type.

A flow diagram for a process for making the EMI/RFI shielding non-metallic substrate chassis of the present invention is shown in FIG. 8 of the drawings. In FIG. 8 the chassis structure and its bosses or appendages or holes for supporting electronic parts is formed in blocks 800, 802, and 804; molds, skeleton frames or similar pliable cloth supporting arrangements may be used in these steps.

The ossifying step at block 806 in FIG. 8 represents the impregnating of the fiberglass cloth with epoxy resin and the subsequent epoxy curing; a plurality of impregnating and curing steps may be desired.

Preparation of the chassis surfaces for the desired two film coatings is achieved at blocks 808 and 810 in FIG. 8, the preparation including physical abrasion and/or etching with chemical reagents, as is known in the art, and the electroless deposition of a thin, adhesion promoting, nickel film, an optional step as is indicated by the bypass line 816.

Deposition of the desired shielding and protective films is achieved in blocks 812 and 814; copper and nickel being the preferred films, as indicated.

The combination of copper and nickel film layers using the electroplating process provides the following desirable characteristics for the FIG. 1 and FIG. 2 structure.

1. Substantially the same level of shielding effectiveness is achieved as in a 0.06-inch thick aluminum structure.

2. The nickel exterior film provides abrasion and environmental resistance to protect the copper-plated surface.

3. A continuous coating is provided over all of the surfaces, including seams, thereby eliminating leaks of EMI/RFI.

4. An excellent electrical ground connection can easily be established—through soldering with tin-lead solder as represented by the solder globule 133, and the ground lead wire 135 connecting with the terminal 137 in FIG. 1.

5. The surface is relatively smooth and can be marked or painted easily.

The preferred arrangement for the non-metallic substrate chassis involves a formed substrate of fiberglass impregnated with epoxy and plated metallic layers on each side of the chassis surface, the plated layers preferably extend around corners and edges of the chassis to preclude radio frequency energy leakage and the plated metallic layers also extend through the depth of holes and apertures in the fiberglass structure to both minimize leakage at these points and to provide conducting paths between the plated films on each surface of the fiberglass substrate. Although nickel is preferred for the chassis outermost film layer, a layer of rhodium can with little doubt be substituted for the nickel layer with only small performance change while yet maintaining reasonable chassis cost. Other alternate metals such as gold and cobalt, while being of good electrical and mechanical properties, would increase the chassis cost unduly.

The nickel on copper plating system described above and applied on both the inside and outside surfaces of a chassis is found to provide EMI shielding equal to that afforded by solid alumium; this plating system promises to overcome a significant obstacle in the use of plastics for chassis. The preferred fiberglass and metal film chassis is capable of achieving a weight savings of up to 30%; this is especially useful in the case of electronic systems intended for use in aircraft or spacecraft but is also desirable in reducing the mass of ground-based equipment.

While the apparatus herein described constitute a preferred embodiment of the invention, it is to be understood that the invention is not limited to this precise form of apparatus or method, and that changes may be made therein without departing from the scope of the invention, which is defined in the appended claims.

TABLE 7

| PROCESS | DESCRIPTION | ADVANTAGES | DISADVANTAGES | APPROXIMATE COST $/Ft$^2$ |
|---|---|---|---|---|
| Arc/Flame Spray | Zinc, Nickel, Aluminum wire sprayed directly on plastic surface | Economical and provides good shielding effectiveness | Application is an art, preheating plastic parts may cause warpage. Complex shapes difficult to coat uniformly. Flaking can cause electrical problems. | $1.00 to $2.50 |
| Conductive Paints | Organic coating containing nickel or silver particles | Easy to apply and economical | Surface rich in non-conductive resin. Difficult to establish electrical ground. | $0.75–$5.00 |
| Conductive Fillers | Aluminum & nickel metallized cloth. | No secondary processing required. Parts can be mass produced. | Difficult to establish electrical ground. Physical properties can be improved or downgraded. | $3.00 and up |
| Vacuum Metallization | Aluminum, copper & nickel deposited deposited plating or vacuum | High conductivity. Economical. Good adhesion. | Very thin coating and easily scratched. Complex shapes could cause non-uniform coating. | $1.25 and up |
| Plating | Electroless and electrolytic deposition of copper or nickel from a chemical solution. | Provides very good shielding effectiveness. Economical, easy to establish electrical ground. Very uniform. | Surface preparation required. | $1.00 for thin electroless coatings of 30 to 50 micro inches. $5.00 for thick electrolytic coating 1–2 mils thick. |
| Conductive Copolymer | Polymer displays electrical conductivity property after doping process. | No secondary processing required. | Chemically unstable and very sensitive to moisture. | Not available |

I claim:

1. Electronic apparatus comprising:

interference active radio frequency means emitting or spuriously responding to radio frequency energy signals;

low mass chassis means supporting, enclosing, and shielding said active radio frequency means, said chassis means including:

an organic material substrate member configured to support said active radio frequency means, said substrate member including a first exterior surface area portion and a second interior surface area portion;

a homogeneous first metallic film layer electrical shield coating disposed over said first exterior surface area portion of said substrate member; and a homogeneous second metallic film layer magnetic shield coating differing in composition from said first metallic film layer coating and disposed over said first metallic film layer in intimate physical contact therewith.

2. The apparatus of claim 1 further including:

a homogeneous third metallic film layer electrical shield coating disposed over said said second interior surface portion of said organic material substrate member and identical in composition with said first metallic film layer electrical shield coating; and a homogeneous fourth metallic film layer magnetic shield coating differing in composition from said third metallic film layer electrical shield coating and disposed over said third metallic film layer coating in intimate physical contact therewith, said fourth metallic film layer coating being identical in composition with said second metallic film layer coating.

3. The apparatus of claim 2 further including an additional homogeneous thin metallic film coating layer means located intermediate said substrate member and said first metallic film layer coating for enhancing the adhesion between said substrate and said first metallic film layer coating.

4. The apparatus of claim 2 wherein said first metallic film layer electrical shield coating is composed of copper.

5. The apparatus of claim 4 wherein said second metalic film layer coating is composed of nickel.

6. The apparatus of claim 5 wherein said substrate member is composed of epoxy-impregnated fiberglass.

7. A lightweight chassis for use with radio frequency electromagnetic interference active electronic apparatus comprising:

an organic material substrate member configured to a closable geometric shape and having a plurality of first intersecting planes surface portions;

closure means closing said substrate member, said closure means including second surface portions;

means located on selected of said first and second surface portions mounting components of said electronic apparatus;

a multi-layered electromagnetic radiation energy shielding and physical protection coating located on said first and second surface portions, said coating also including;

a first homogeneous metallic copper film electrical shielding layer disposed over reverse faces of said substrate member and closure means in intimate physical contact therewith; and a second homogeneous metallic nickel film magnetic shielding layer disposed over said first film layer on said substrate member and closure means in intimate physical contact therewith.

8. The chassis of claim 7 further including shielding divider elements located within said closable geometric shape and connected with one of said substrate member and closure means.

9. The chassis of claim 7 wherein said organic material substrate is comprised of fiberglass cloth impregnated with epoxy resin.

10. The chassis of claim 9 further including an adhesion-promotion thin coating layer intermediate said substrate member and closure means surface portions and said first metallic film layer.

11. The chassis of claim 10 further including a tin-lead solder electrical connection with said nickel metallic film layer.

12. A method for making a non-metallic electrostatic field and electromagnetic field shielding chassis for an electronic apparatus comprising the steps of:

forming an open sided closable chassis structure, having interior and exterior surfaces, from a pliable non-metallic substrate material;

adding electronic component supporting elements to said chassis structure;

ossifying said pliable material into a rigid fixed shape;

covering said chassis structure interior and exterior surfaces with a first metallic film layer of good electrical conductivity; and coating said first metallic film layer with a second and different metallic film layer on both said interior and exterior surfaces.

13. The method of claim 12 wherein said step of adding electronic component supporting elements includes perforating said chassis structure.

14. The method of claim 12 further including the step of forming an open sided closure member capable of cooperating with said chassis in forming a closed structure and ossifying with said chassis in forming a closed structure and ossifying said closure members.

15. The method of claim 12 wherein said pliable substrate material includes fiber reinforcing material.

16. The method of claim 12 further including the step of applying an adhesion-promoting layer to said chassis structure prior to said covering step.

17. The method of claim 12 wherein said covering step includes depositing said first film layer using a chemical precipitation deposition sequence.

18. The method of claim 12 wherein said coating step includes electroplating.

19. The chassis of claim 10 wherein said adhesion-promoting thin coating layer comprises a layer of nickel.

* * * * *